(12) United States Patent
Tian et al.

(10) Patent No.: US 12,495,520 B2
(45) Date of Patent: Dec. 9, 2025

(54) AIR-LIQUID COOLING SYSTEM USING SEASONAL TEMPERATURE DIFFERENCES

(71) Applicant: Beijing Youzhuju Network Technology Co., Ltd., Beijing (CN)

(72) Inventors: Ting Tian, Beijing (CN); Bing Gao, Beijing (CN); Xiaoliang Guo, Beijing (CN); Tangbo Jing, Beijing (CN); Jian Wang, Beijing (CN)

(73) Assignee: BEIJING YOUZHUJU NETWORK TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 19/004,084

(22) Filed: Dec. 27, 2024

(65) Prior Publication Data

US 2025/0142774 A1    May 1, 2025

Related U.S. Application Data

(63) Continuation of application No. PCT/CN2023/103814, filed on Jun. 29, 2023.

(30) Foreign Application Priority Data

Jul. 13, 2022 (CN) .......................... 202210826177.1

(51) Int. Cl.
  *H05K 7/20* (2006.01)
(52) U.S. Cl.
  CPC ..... *H05K 7/20272* (2013.01); *H05K 7/20745* (2013.01); *H05K 7/2079* (2013.01)
(58) Field of Classification Search
  CPC . H05K 7/20272; H05K 7/20763–2079; H05K 7/20718–20745; G06F 1/20
  See application file for complete search history.

(56) References Cited

U.S. PATENT DOCUMENTS

| | | | |
|---|---|---|---|
| 6,970,355 B2 * | 11/2005 | Ellsworth, Jr. | .... H05K 7/20781 174/15.1 |
| 8,018,718 B2 * | 9/2011 | Goth | ....... F25B 49/02 361/699 |

(Continued)

FOREIGN PATENT DOCUMENTS

| | | |
|---|---|---|
| CN | 105299807 B | 4/2018 |
| CN | 108513497 A | 9/2018 |

(Continued)

OTHER PUBLICATIONS

International Search Report for PCT/CN2023/103814, mailed on Sep. 28, 2023, 5 pages.

(Continued)

*Primary Examiner* — Zachary Pape
(74) *Attorney, Agent, or Firm* — Astute IP Law Group

(57) ABSTRACT

Embodiments of the disclosure provide a cooling system including an air cooling part including a first cooler and a first circulation pipeline, the first cooler being configured to cool a coolant inside it with an external liquid, and the first circulation pipeline including a first liquid outlet pipe and a first liquid return pipe; a liquid cooling part including a second cooler and a second circulation pipeline, the second cooler being configured to cool a coolant inside it with an external gas, and the second circulation pipeline including a second liquid outlet pipe and a second liquid return pipe; and a guide assembly connected between the first circulation pipeline and the second circulation pipeline.

9 Claims, 4 Drawing Sheets

(56) References Cited

U.S. PATENT DOCUMENTS

| | | | |
|---|---|---|---|
| 11,297,741 B2 * | 4/2022 | Gao | ............... H05K 7/2079 |
| 2009/0219681 A1 | 9/2009 | Goth et al. | |
| 2011/0239671 A1 | 10/2011 | Malone et al. | |
| 2015/0173251 A1 | 6/2015 | Campbell et al. | |
| 2018/0042140 A1 * | 2/2018 | Pan | ............... H05K 7/20772 |
| 2019/0056130 A1 | 2/2019 | Carlson et al. | |
| 2021/0204449 A1 | 7/2021 | Gao | |

FOREIGN PATENT DOCUMENTS

| | | | | |
|---|---|---|---|---|
| CN | 210107607 U | | 2/2020 | |
| CN | 213877263 U | | 8/2021 | |
| CN | 215187964 U | | 12/2021 | |
| CN | 114245654 A | | 3/2022 | |
| CN | 114269129 A | | 4/2022 | |
| CN | 114706455 A | | 7/2022 | |
| CN | 115226375 A | | 10/2022 | |
| DE | 10231982 A1 * | 3/2003 | ......... H05K 7/20309 |
| JP | 2014229741 A | | 12/2014 | |

OTHER PUBLICATIONS

Notification of Granting Patent Right for Chinese Patent Application No. 202210826177.1, mailed on May 10, 2024, 10 pages.
Decision to Grant for Japanese Patent Application No. 2024-576589, mailed on Jun. 3, 2025, 6 pages.
Extended European Search Report for European Patent Application No. 23838708.8, mailed on Sep. 22, 2025, 11 pages.

* cited by examiner

AIR-LIQUID COOLING SYSTEM USING SEASONAL TEMPERATURE DIFFERENCES

CROSS-REFERENCE

This application is a continuation of International Patent Application No. PCT/CN2023/103814, filed on Jun. 29, 2023, which claims priority of the Chinese invention patent application with application No. 202210826177.1 and entitled "COOLING SYSTEM" filed on Jul. 13, 2022, the entireties of which are incorporated herein by reference.

FIELD

Embodiments of the present disclosure generally relate to a technical field of electronic device cooling, and more particularly, to a cooling system.

BACKGROUND

With integration and development of new generation information communication technologies such as 5G, cloud computing, big data, artificial intelligence and the like and entity economic, a data center is gradually expanding from serving a part of enterprises to serving the whole society and becomes a new infrastructure. Therefore, a problem of energy and water resource consumption brought by the data center is widely concerned worldwide.

Energy consumption of the data center is increased, a traditional air cooling heat dissipation solution is low in heat dissipation efficiency and needs to consume a large amount of energy, and therefore a demand of the data center cannot be met increasingly in cooling capacity and economic feasibility. To this end, a liquid cooling solution becomes an important technical direction for data center construction. A conventional liquid cooling solution is cold plate liquid cooling. Since complexity of design of a server cold plate is high, only heat of critical components such as a central processing unit (CPU) and a graphics processor (GPU) is typically dissipated to outside from the cold plate via a coolant in a general server, while heat of remaining components is taken away by an indoor air conditioning system.

At present, there is a need for an improved data center liquid cooling scheme.

SUMMARY

An object of the present disclosure is to provide a cooling system to at least partially solve above problems.

In first aspect of the present disclosure, there is provided a cooling system, including: an air cooling part including a first cooler and a first circulation pipe connected to the first cooler, the first cooler being configured to cool a coolant inside it with an external liquid, and the first circulation pipe including a first liquid outlet pipe and a first liquid return pipe; a liquid cooling part including a second cooler and a second circulation pipe connected to the second cooler, the second cooler being configured to cool a coolant inside it with an external gas, and the second circulation pipeline including a second liquid outlet pipe and a second liquid return pipe; and a guide assembly connected between the first circulation pipeline and the second circulation pipeline and configured to: in a first state, drive a part of the coolant in the first liquid outlet pipe into the second liquid outlet pipe and guide at least a part of the coolant in the second liquid return pipe into the first liquid return pipe, and in a second state, drive a part of the coolant in the second liquid outlet pipe into the first liquid outlet pipe and guide at least a part of the coolant in the first liquid return pipe into the second liquid return pipe.

In some embodiments, the guide assembly includes: a first circulation pump running in the first state and stopping running in the second state, the first circulation pump, upon running, driving a part of the coolant in the first liquid outlet pipe into the second liquid outlet pipe; and a second circulation pump running in the second state and stopping running in the first state, the second circulation pump, upon running, driving a part of the coolant in the second liquid outlet pipe into the first liquid outlet pipe.

In some embodiments, the guide assembly further includes a first valve, a second valve, a third valve, and a fourth valve; the first valve and the first circulation pump are connected in series between the first liquid outlet pipe and the second liquid outlet pipe, and the first valve is opened in the first state and closed in the second state; the second valve and the second circulation pump are connected in series between the first liquid outlet pipe and the second liquid outlet pipe, and the second valve is opened in the second state and closed in the first state; the third valve is connected between the first liquid return pipe and the second liquid return pipe, and the third valve is opened in the first state and closed in the second state; and the fourth valve is connected between the first liquid return pipe and the second liquid return pipe, and the fourth valve is opened in the second state and closed in the first state.

In some embodiments, the guide assembly further includes a first valve, a second valve, and a third valve; the first valve and the first circulation pump are connected in series between the first liquid outlet pipe and the second liquid outlet pipe, and the first valve is opened in the first state and closed in the second state; the second valve and the second circulation pump are connected in series between the first liquid outlet pipe and the second liquid outlet pipe, and the second valve is opened in the second state and closed in the first state; and the third valve is connected between the first liquid return pipe and the second liquid return pipe, and the third valve is opened in both the first state and the second state.

In some embodiments, the guide assembly further includes a first valve and a second valve; the first circulation pump and the second circulation pump are connected in parallel and are connected in series with the first valve between the first liquid outlet pipe and the second liquid outlet pipe, and the first valve is opened in both the first state and the second state; and the second valve is connected between the first liquid return pipe and the second liquid return pipe, and the second valve is opened in both the first state and the second state.

In some embodiments, the guide assembly further includes a first valve and a second valve; the first valve, the first circulation pump and the second circulation pump are connected in series between the first liquid outlet pipe and the second liquid outlet pipe, and the first valve is opened in both the first state and the second state; and the second valve is connected between the first liquid return pipe and the second liquid return pipe, and the second valve is opened in both the first state and the second state.

In some embodiments, the guide assembly includes: a liquid storage cavity connected to the first liquid outlet pipe and the second liquid outlet pipe through a valve, and configured to receive the coolant from the first liquid outlet pipe in the first state and receive the coolant from the second liquid outlet pipe in the second state; and a third circulation pump connected to the liquid storage cavity and configured to drive a coolant in the liquid storage cavity to the second liquid outlet pipe in the first state and drive the coolant in the liquid storage cavity to the first liquid outlet pipe in the second state.

In some embodiments, the guide assembly further includes a first valve, a second valve, a third valve, and a fourth valve; the first valve is connected between the first liquid outlet pipe and the liquid storage cavity, and the first valve is opened in the first state and closed in the second state; the second valve is connected between the second liquid outlet pipe and the liquid storage cavity, and the second valve is opened in the second state and closed in the first state; the third valve is connected between the first liquid outlet pipe and an outlet of the third circulation pump, and the third valve is opened in the second state and closed in the first state; and the fourth valve is connected between the outlet of the third circulation pump and the second liquid outlet pipe, and the fourth valve is opened in the first state and closed in the second state.

In some embodiments, the guide assembly further includes a fifth valve connected between the first liquid return pipe and the second liquid return pipe, and the fifth valve is opened in both the first state and the second state.

In some embodiments, the first cooler includes a cooling tower, and/or the second cooler includes a dry cooler.

According to embodiments of the present disclosure, by arranging the guide assembly between an air cooling part and the liquid cooling part, an air temperature difference in different seasons may be utilized to supplement cold between the air cooling part and the liquid cooling part supplemented, and advantages of the first cooler and the second cooler are fully utilized. In a low-temperature season, the second cooler may be utilized to supplement cold to the air cooling part, a natural cooling proportion is improved, and power supply efficiency (PUE) and water resource utilization rate (WUE) are remarkably reduced. In a high-temperature season, the first cooler can be utilized to supplement the liquid cooling part, so that an initial investment cost and an occupied area of the second cooler are saved.

It should be understood that content described in this content part is not intended to limit key features or important features of the embodiments of the present disclosure, nor is it intended to limit a scope of the present disclosure. Other features of the present disclosure will become readily understood from following description.

BRIEF DESCRIPTION OF DRA WINGS

The above and other features, advantages, and aspects of various embodiments of the present disclosure will become more apparent from following detailed description taken in conjunction with drawings. In the drawings, the same or similar reference numbers refer to the same or similar elements, wherein.

DETAILED DESCRIPTION

Figure 1:
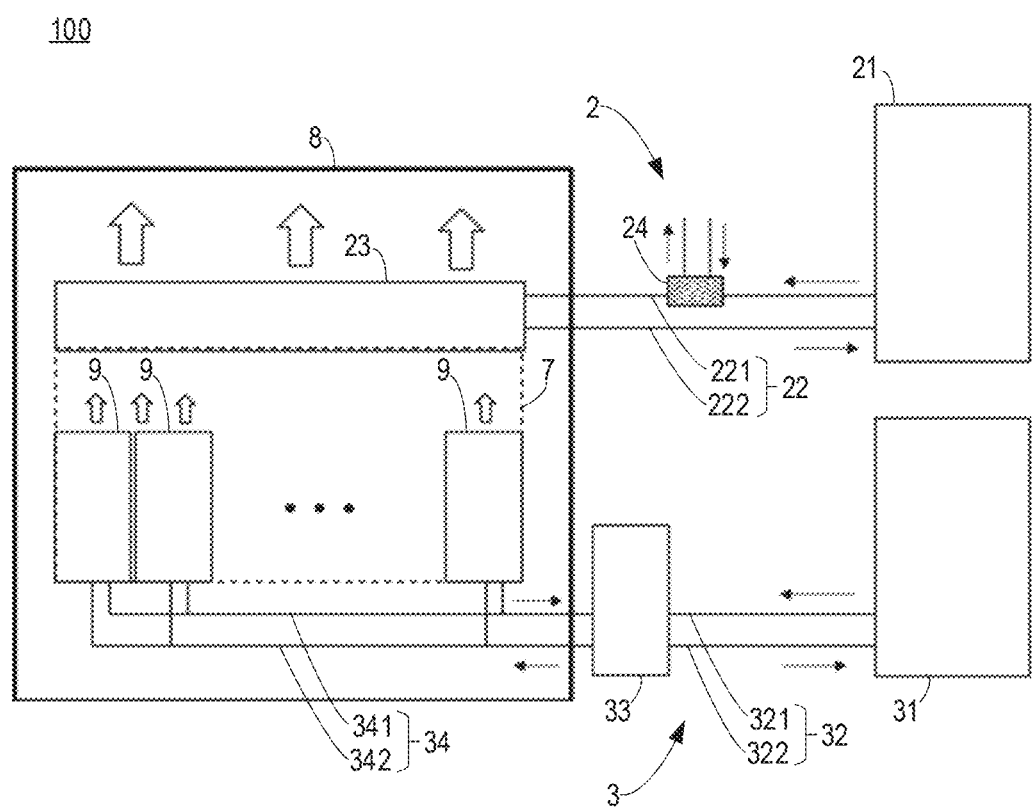
FIG. 1 illustrates a schematic structural diagram of a conventional cooling system.

Preferred embodiments of the present disclosure will be described in more detail below with reference to the drawings. While preferred embodiments of the present disclosure are shown in the drawings, it should be understood that the present disclosure may be implemented in various forms and should not be limited by the embodiments set forth herein. Rather, these embodiments are provided to make the present disclosure more thorough and complete, and to fully convey the scope of the present disclosure to those skilled in the art.

As used herein, the term "including" and deformation thereof represent openness, i.e., "including but not limited to". Unless specifically stated, the term "or" means "and/or". The term "based on" means "based at least in part on". The terms "an example embodiment" and "an embodiment" mean "at least one example embodiment". The term "another embodiment" means "at least one further embodiment". The terms "first," "second," and the like may refer to different or identical object.

FIG. 1 illustrates a schematic structural diagram of a conventional cooling system 100. As shown in FIG. 1, the cooling system 100 described herein generally includes an air cooling part 2 and a liquid cooling part 3. The liquid cooling part 3 is configured to take away heat of key components such as a CPU and a GPU in a cabinet 9, and the air cooling part 2 is configured to take away heat of other components in the cabinet 9.

In some embodiments, as shown in FIG. 1, the air cooling part 2 includes a first cooler 21 and a first circulation pipeline 22 connected to the first cooler 21. The first cooler 21 is configured to cool a coolant inside it with an external liquid. For example, the first cooler 21 may be a cooling tower, and the coolant inside it may be cooled with sprayed cooling water. The first circulation pipeline 22 includes a first liquid outlet pipe 221 and a first liquid return pipe 222. The coolant cooled by external cooling water in the first cooler 21 may flow out via the first liquid outlet pipe 221, and warmed coolant circulated in the air cooling part 2 may be returned to the first cooler 21 via the first liquid return pipe 222, and then cooled by the first cooler 21.

It should be understood that the cooling tower is merely an example of the first cooler 21, and in the embodiments according to the present disclosure, the first cooler 21 may be other types of coolers that utilize an external liquid to cool the coolant inside it, which is not limited in the embodiments of the present disclosure.

In some embodiments, as shown in FIG. 1, the air cooling part 2 further includes a wind wall 23 disposed in a room cold pool 8. The air wall 23 may be provided with a heat dissipation pipe communicating with the first liquid outlet pipe 221 and the first liquid return pipe 222, so that the coolant may flow into the heat dissipation pipe from the first liquid outlet pipe 221 and flow into the first liquid return pipe 222 from the heat dissipation pipe. The air wall 23 may also be provided with a fan which is configured to drive an air flow in the cabinet 9 to flow through the air wall 23, so that a hot air from the cabinet 9 is cooled by the heat dissipation pipe in the air wall 23, and a cooled air is discharged into a room cold pool 8. In this process, the coolant in the heat dissipation pipe of the air wall 23 is heated due to heat absorption, and a heated coolant may flow back to the first cooler 21 via the first liquid return pipe 222, and then cooled by the external cooling water again in the first cooler 21 for next circulation.

In some embodiments, as shown in FIG. 1, in order to promote driving of the fan in the air wall 23 to gas in the cabinet 9, a closed gas passage 7 may be formed between the cabinet 9 and the air wall 23, so that the gas from the cabinet 9 may be guided into the air wall 23 via the gas passage 7.

It should be understood that in embodiments according to the present disclosure, the air wall 23 is merely exemplary, and other types of gas driving apparatus or arrangements are possible. For example, in some embodiments, the air cooling part 2 may include an inter-column air conditioner disposed next to each cabinet 9, and the inter-column air conditioner is connected to the first liquid outlet pipe 221 and the first liquid return pipe 222. The inter-column air conditioner may blow air to the inside of the cabinet 9 laterally, thereby removing heat from components inside the cabinet 9.

In some embodiments, as shown in FIG. 1, the air cooling part 2 further includes a supplementary cold source 24 according to weather and regions. The supplemental cold source 24 is disposed in the first liquid outlet pipe 221 and is configured to provide an additional cooling amount to a circulation pipeline of the air cooling part 2. Cooling capacity of the air cooling part 2 can be further improved with the supplementary cold source 24.

In some embodiments, as shown in FIG. 1, the liquid cooling part 3 includes a second cooler 31 and a second circulation pipe 32 connected to the second cooler 31. The second cooler 31 is configured to cool a coolant inside it with an external gas. For example, the second cooler 31 may be a dry cooler, which may utilize an external air to cool the coolant inside it. The second circulation pipeline 32 includes a second liquid outlet pipe 321 and a second liquid return pipe 322. The coolant cooled by the external gas in the second cooler 31 may flow out via the second liquid outlet pipe 321, and a warmed coolant circulated in the liquid cooling part 3 may return to the second cooler 31 via the second liquid return pipe 322, and then cooled by the second cooler 31.

It should be understood that the dry cooler is merely an example of the second cooler 31, and in an embodiment according to the present disclosure, the second cooler 31 may be another type of cooler that utilizes external gas to cool the coolant inside it, which is not limited in the embodiments of the present disclosure.

In some embodiments, as shown in FIG. 1, the liquid cooling part 3 further includes a cold distribution unit (CDU) 33 and a third circulation pipeline 34. The cold distribution unit 33 is connected between the third circulation pipeline 34 and the second circulation pipeline 32 for distributing and managing cold provided to the cabinet 9. The third circulation pipeline 34 is connected to a cold plate disposed in the cabinet 9 for cooling critical components such as CPUs and GPUs. A water supply temperature of the cold plate may be as high as 45-50° C., and a return water temperature can reach 60° C., so that the cold plate can be naturally cooled in most regions throughout a year. The third circulation pipeline 34 includes a third liquid outlet pipe 342 and a third liquid return pipe 341. The cold distribution unit 33 may provide the coolant to the cold plate via the third liquid outlet pipe 342, and the coolant heated in the cold plate may return to the cold distribution unit 33 via the third liquid return pipe 341. The cold distribution unit 33 may include a plate heat exchanger, the plate heat exchanger is connected to the second circulation pipeline 32 to form a first coolant circulation path, and the plate heat exchanger is connected to the third circulation pipeline 34 to form a second coolant circulation path. The coolant in two circulation paths may exchange heat via the plate heat exchanger.

In some embodiments, the second circulation pipeline 32 may be directly connected to a cold plate in the cabinet 9, so as to directly provide the coolant to critical components such as a CPU and a GPU without exchanging heat with the coolant in the two circulation paths through the cold distribution unit 33. In some other embodiments, the liquid cooling part 3 may include a plurality of cold distribution units 33 and a plurality of coolant circulation paths for more heat exchange, which is not limited in the embodiments of the present disclosure.

Due to development of electronic components, especially a gradual increase of a heating amount of components such as memory and hard disks, heat carried away by the air cooling part 2 becomes more and more considerable. However, since the air cooling part 2 exchanges heat with a hot air, its heat exchange efficiency is low, and it is necessary to use the first cooler 21 such as a cooling tower to provide a lower water supply temperature to achieve effective cooling. Therefore, the air cooling part 2 has a high energy consumption and a large water consumption, which causes a data center to control power usage rate (PUE) and water resource percentage utilization rate (WUE) at a lower level even if the liquid cooling part 3 is used.

Since the cold plate in the liquid cooling part 3 can directly deliver the coolant to a surface of a server, a heat exchange efficiency is very high, and a water temperature tends to be high, so an energy-saving and water-saving external cooling device like the second cooler 31 such as the dry cooler may be selected. The disadvantage of the second cooler 31 is that in summer, since a difference of outdoor temperature and coolant temperature become smaller, the heat dissipation efficiency of the second cooler 31 becomes low, in order to meet requirement of cold quantity in extreme weather, it is often need to make a heat exchange area of the second cooler 31 large, so that an initial investment is increased and an occupied area is increased, so that when a ultra-large scale data center is deployed, use of this water-saving type second cooler 31 is limited, and in turn, a less energy-saving and water-saving cooling tower and the same type of external cooling device are adopted. In addition, in a season of lower air temperature, such as winter, cold quantity generated by the second cooler 31 is exhausted, which may cause waste.

According to the embodiments of the present disclosure, a cooling system 100 is provided to utilize the air temperature difference in different seasons to make cold between the air cooling part 2 and the liquid cooling part 3 are mutually supplemented, thereby fully utilizing respective advantages of the first cooler 21 and the second cooler 31. Principles of the present disclosure will be described in detail below with reference to FIGS. 2 to 6.

Figure 2:
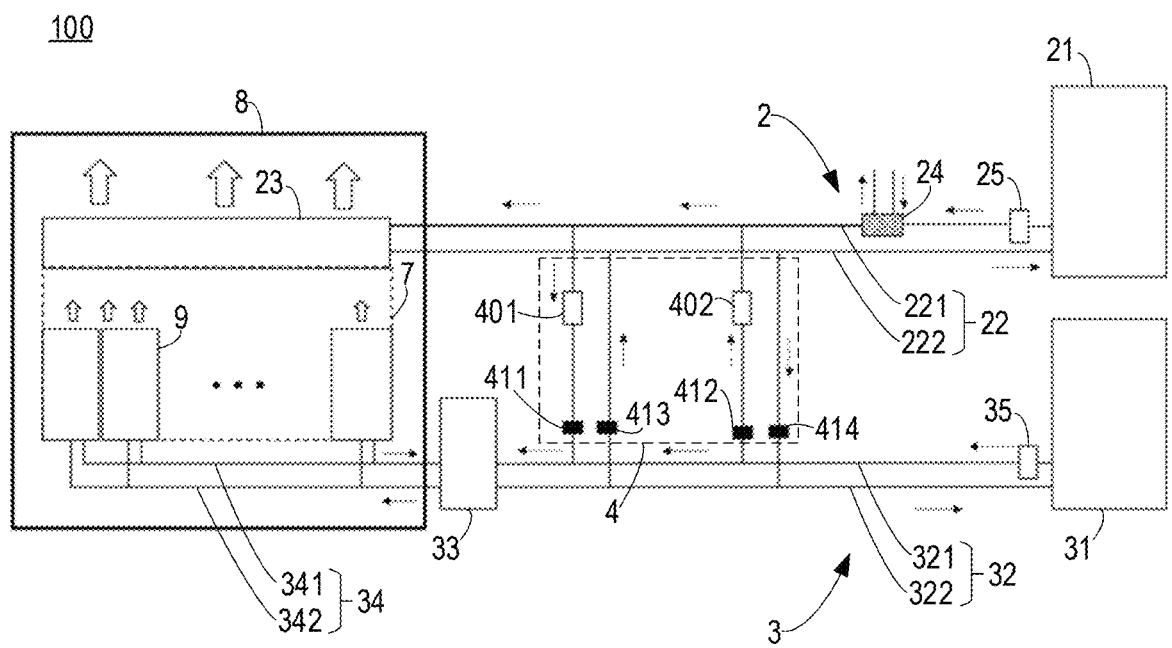
FIG. 2 illustrates a schematic structural diagram of a cooling system according to some embodiments of the present disclosure.

FIG. 2 illustrates a schematic structural diagram of a cooling system 100 according to some embodiments of the present disclosure. As shown in FIG. 2, the cooling system 100 includes an air cooling part 2 and a liquid cooling part 3. Structure of the air cooling part 2 and the liquid cooling part 3 shown in FIG. 2 is similar to that of the air cooling part 2 and the liquid cooling part 3 shown in FIG. 1, and differences between them will be described in detail hereinafter, and will not be repeated for the same part.

In some embodiments, as shown in FIG. 2, the air cooling part 2 further includes a coolant circulation pump 25, and the coolant circulation pump 25 is disposed in the first liquid outlet pipe 221 for driving the coolant to circulate in the air cooling part 2.

In some embodiments, as shown in FIG. 2, the liquid cooling part 3 further includes a coolant circulation pump 35, and the coolant circulation pump 35 is disposed in the second liquid outlet pipe 321 for driving the coolant to circulate in the first coolant circulating path of the liquid cooling part 3.

In some embodiments, as shown in FIG. 2, the cooling system 100 further includes a guide assembly 4 connected between the first circulation pipeline 22 and the second circulation pipeline 32. The guide assembly 4 is switchable between a first state and a second state. In the first state, the guide assembly 4 can drive a part of the coolant in the first liquid outlet pipe 221 into the second liquid outlet pipe 321 and guide at least a part of the coolant in the second liquid return pipe 322 into the first liquid return pipe 222. In the second state, the guide assembly 4 can drive a part of the coolant in the second liquid outlet pipe 321 into the first liquid outlet pipe 221 and guide at least a part of the coolant in the first liquid return pipe 222 into the second liquid return pipe 322.

In a high temperature season (such as summer), the guide assembly 4 may be placed in the first state so that a part of the coolant in the first liquid outlet pipe 221 may flow into the second liquid outlet pipe 321. In this way, the first cooler 21 may be utilized to supplement cold to the liquid cooling part 3, thereby saving an initial investment cost and an occupied area of the second cooler 31.

In a low temperature season (such as winter, spring, and autumn), the guide assembly 4 may be placed in the second state so that a part of the coolant in the second liquid outlet 321 may flow into the first liquid outlet 221. In this way, the second cooler 31 may be utilized to supplement cold to the air cooling part 2, improving the natural cooling proportion, and significantly reducing the PUE and the WUE.

In some embodiments, as shown in FIG. 2, the guide assembly 4 includes a first circulation pump 401 and a second circulation pump 402. The first circulation pump 401 and the second circulation pump 402 are disposed in different branches. The first circulation pump 401 runs in the first state and stops running in the second state. The first circulation pump 401, upon running, can drive a part of the coolant in the first liquid outlet pipe 221 into the second liquid outlet pipe 321. The second circulation pump 402 runs in the second state and stops running in the first state. The second circulation pump 402, upon running, can drive a part of the coolant in the second liquid outlet pipe 321 into the first liquid outlet pipe 221. The first circulation pump 401 and the second circulation pump 402 can drive the coolant to circulate between the air cooling part 2 and the liquid cooling part 3, so as to achieve supplementing cold mutually as needed. For example, in the high temperature season, the first circulation pump 401 may drive a part of the coolant in the first liquid outlet pipe 221 into the second liquid outlet pipe 321; and in the low temperature season, the second circulation pump 402 may drive a part of the coolant in the second liquid outlet pipe 321 into the first liquid outlet pipe 221.

In some embodiments, as shown in FIG. 2, the guide assembly 4 further includes a first valve 411, a second valve 412, a third valve 413, and a fourth valve 414. The first valve 411 and the first circulation pump 401 are connected in series between the first liquid outlet pipe 221 and the second liquid outlet pipe 321. The first valve 411 is opened in the first state and closed in the second state. The second valve 412 and the second circulation pump 402 are connected in series between the first liquid outlet pipe 221 and the second liquid outlet pipe 321. The second valve 412 is opened in the second state and closed in the first state. The third valve 413 is connected between the first liquid return pipe 222 and the second liquid return pipe 322. The third valve 413 is opened in the first state and closed in the second state. The fourth valve 414 is connected between the first liquid return pipe 222 and the second liquid return pipe 322. The fourth valve 414 is opened in the second state and closed in the first state.

In some embodiments, as shown in FIG. 2, the first circulation pump 401 is connected to the first liquid outlet pipe 221, and the first valve 411 is connected to the second liquid outlet pipe 321. In other embodiments, the first circulation pump 401 and the first valve 411 may be interchanged in position, that is, the first circulation pump 401 may be connected to the second liquid outlet pipe 321, and the first valve 411 may be connected to the first liquid outlet pipe 221.

In some embodiments, as shown in FIG. 2, the second circulation pump 402 is connected to the first liquid outlet pipe 221, and the second valve 412 is connected to the second liquid outlet pipe 321. In other embodiments, the second circulation pump 402 and the second valve 412 may be interchanged in position, that is, the second circulation pump 402 may be connected to the second liquid outlet pipe 321, and the second valve 412 may be connected to the first liquid outlet pipe 221.

In the first state, the first circulation pump 401 runs and the second circulation pump 402 stops running. At this time, the first valve 411 and the third valve 413 are opened, and the second valve 412 and the fourth valve 414 are closed. With such an arrangement, the first circulation pump 401 may drive a part of the coolant in the first liquid outlet pipe 221 into the second liquid outlet pipe 321; while at least a part of the coolant in the second liquid return pipe 322 may be guided into the first liquid return pipe 222 via the third valve 413 and flow into the first cooler 21 for cooling again. Therefore, when an outdoor temperature is high, since cold quantity of the first cooler 21 is easier to obtain, a part of cold quantity in the air cooling part 2 may be provided to the liquid cooling part 3, and the second cooler 31 does not need to be made very large in order to achieve a cold quantity requirement of the liquid cooling part 3 in extreme weather, and will have a good saving on economy.

In the second state, the second circulation pump 402 runs and the first circulation pump 401 stops running. At this time, the second valve 412 and the fourth valve 414 are opened, and the first valve 411 and the third valve 413 are closed. With such an arrangement, the second circulation pump 402 may drive a part of the coolant in the second liquid outlet pipe 321 into the first liquid outlet pipe 221; while at least a part of the coolant in the first liquid return pipe 222 may be guided into the second liquid return pipe 322 via the fourth valve 414 and flow into the second cooler 31 for cooling again. Therefore, when the outdoor temperature is lower, a heat exchange efficiency of the second cooler 31 is high, and cold quantity of the second cooler 31 may be provided to the air cooling part 2 to help the air wall 23 to cool. In this case, the first cooler 21 may only partially run or even completely stop, to comprehensively improve the natural cooling proportion of the data center, thereby achieving a large amount of energy consumption saving and water consumption saving.

In some embodiments, when no cold circulation is required between the air cooling part 2 and the liquid cooling part 3, the first circulation pump 401 and the second circulation pump 402 may both stop running and the first valve 411, the second valve 412, the third valve 413, and the fourth valve 414 may both be closed. In this case, the air cooling part 2 and the liquid cooling part 3 can operate independently.

Figure 3:
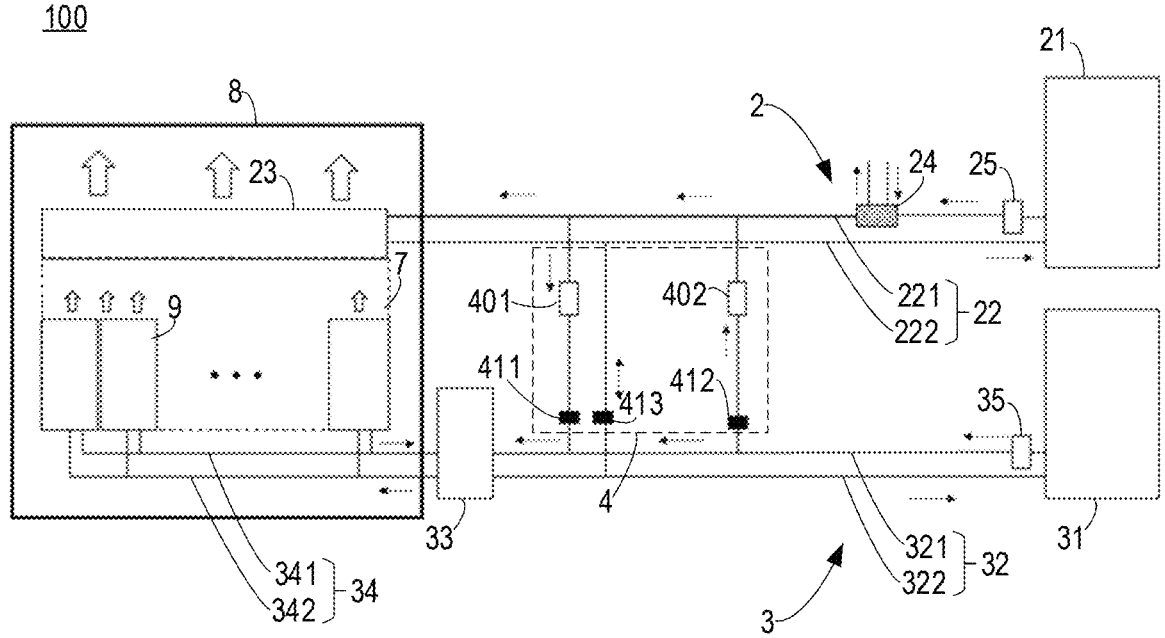
FIG. 3 illustrates a schematic structural diagram of a cooling system according to some embodiments of the present disclosure.

FIG. 3 illustrates a schematic structural diagram of a cooling system 100 according to some embodiments of the present disclosure. Structure of the cooling system 100 shown in FIG. 3 is similar to that of the cooling system 100 shown in FIG. 2, and differences between them will be described in detail hereinafter, and will not be repeated for the same part.

As shown in FIG. 3, the guide assembly 4 includes a first circulation pump 401 and a second circulation pump 402. The first circulation pump 401 and the second circulation pump 402 are disposed in different branches. The first circulation pump 401 runs in the first state and stops running in the second state. The first circulation pump 401, upon running, can drive a part of the coolant in the first liquid outlet pipe 221 into the second liquid outlet pipe 321. The second circulation pump 402 runs in the second state and stops running in the first state. The second circulation pump 402, upon running, can drive a part of the coolant in the second liquid outlet pipe 321 into the first liquid outlet pipe 221.

In some embodiments, as shown in FIG. 3, the guide assembly 4 further includes a first valve 411, a second valve 412, and a third valve 413. The first valve 411 and the first circulation pump 401 are connected in series between the first liquid outlet pipe 221 and the second liquid outlet pipe 321. The first valve 411 is opened in the first state and closed in the second state. The second valve 412 and the second circulation pump 402 are connected in series between the first liquid outlet pipe 221 and the second liquid outlet pipe 321. The second valve 412 is opened in the second state and closed in the first state. The third valve 413 is connected between the first liquid return pipe 222 and the second liquid return pipe 322. The third valve 413 is opened in both the first state and the second state.

Since the third valve 413 is opened in both the first state and the second state, when the guide assembly 4 is in the first state and the second state, the coolant circulation between the first liquid return pipe 222 and the second liquid return pipe 322 may both be realized via a branch where the third valve 413 is opened. For example, at least a part of the coolant in the second liquid return pipe 322 may flow into the first liquid return pipe 222 via the third valve 413 and into the first cooler 21 for cooling again while the guide assembly 4 is in the first state; and at least a part of the coolant in the first liquid return pipe 222 may flow into the second liquid return pipe 322 via the third valve 413 and into the second cooler 31 again for cooling while the guide assembly 4 is in the second state. Compared with the guide assembly 4 shown in FIG. 2, the guide assembly 4 shown in FIG. 3 has a simpler structure and saves cost.

In some embodiments, when no cold circulation is required between the air cooling part 2 and the liquid cooling part 3, the first circulation pump 401 and the second circulation pump 402 may both stop running, and the first valve 411, the second valve 412, and the third valve 413 are both closed. In this case, the air cooling part 2 and the liquid cooling part 3 can run independently.

Figure 4:
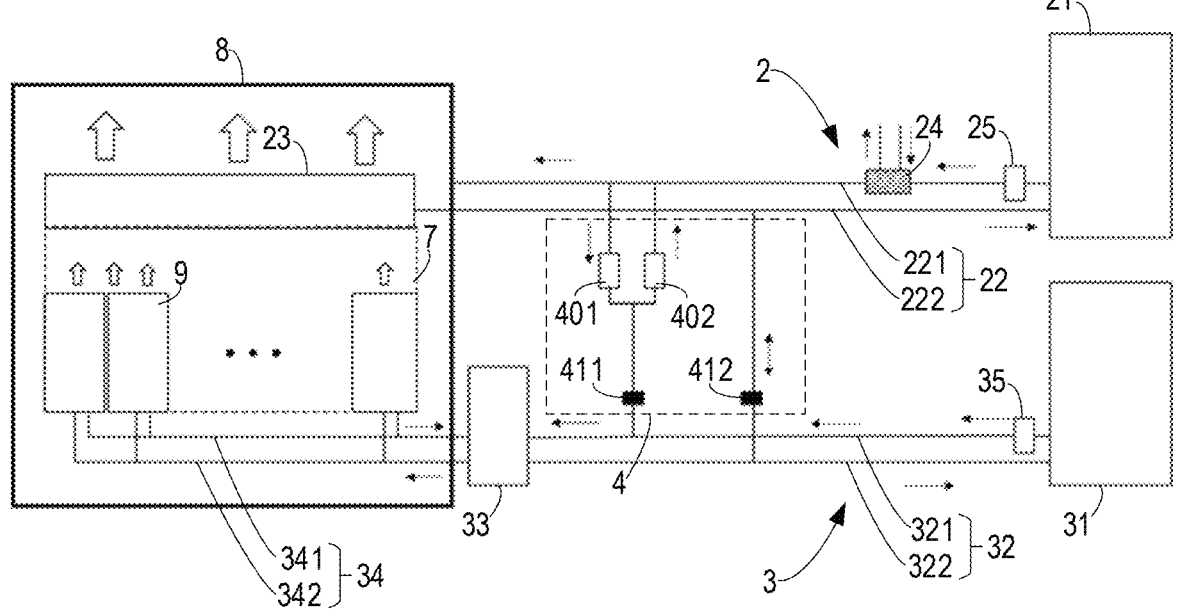
FIG. 4 illustrates a schematic structural diagram of a cooling system according to some embodiments of the present disclosure.

FIG. 4 illustrates a schematic structural diagram of a cooling system 100 according to some embodiments of the present disclosure. Structure of the cooling system 100 shown in FIG. 4 is similar to that of the cooling system 100 shown in FIG. 3, and differences between them will be described in detail hereinafter, and will not be repeated for the same part.

As shown in FIG. 4, the guide assembly 4 includes a first circulation pump 401 and a second circulation pump 402. The first circulation pump 401 and the second circulation pump 402 are connected in parallel. The first circulation pump 401 runs in the first state and stops running in the second state. The first circulation pump 401, upon running, can drive a part of the coolant in the first liquid outlet pipe 221 into the second liquid outlet pipe 321. The second circulation pump 402 runs in the second state and stops running in the first state. The second circulation pump 402, upon running, can drive a part of the coolant in the second liquid outlet pipe 321 into the first liquid outlet pipe 221.

In some embodiments, as shown in FIG. 4, the guide assembly 4 further includes a first valve 411 and a second valve 412. The first circulation pump 401 and the second circulation pump 402 are connected in series with the first valve 411 between the first liquid outlet pipe 221 and the second liquid outlet pipe 321 after being connected in parallel. The first valve 411 is opened in both the first state and the second state. The second valve 412 is connected between the first liquid return pipe 222 and the second liquid return pipe 322. The second valve 412 is opened in both the first state and the second state.

In some embodiments, as shown in FIG. 4, the first circulation pump 401 and the second circulation pump 402 are connected to the first liquid outlet pipe 221, and the first valve 411 is connected to the second liquid outlet pipe 321. In other embodiments, the first circulation pump 401 and the second circulation pump 402 and the first valve 411 may be interchanged in position, that is, the first circulation pump 401 and the second circulation pump 402 may be connected to the second liquid outlet pipe 321, and the first valve 411 may be connected to the first liquid outlet pipe 221.

Since the first valve 411 is both opened in the first state and the second state, when the guide assembly 4 is in the first state and the second state, both the first circulation pump 401 and the second circulation pump 402 can drive the coolant to circulate between the air cooling part 2 and the liquid cooling part 3 via the first valve 411. Compared with the guide assembly 4 shown in FIG. 3, the guide assembly 4 shown in FIG. 4 has a simpler structure and saves cost.

In some embodiments, when no cold circulation is required between the air cooling part 2 and the liquid cooling part 3, the first circulation pump 401 and the second circulation pump 402 may both stop running, and both the first valve 411 and the second valve 412 may be closed. In this case, the air cooling part 2 and the liquid cooling part 3 can run independently.

Figure 5:
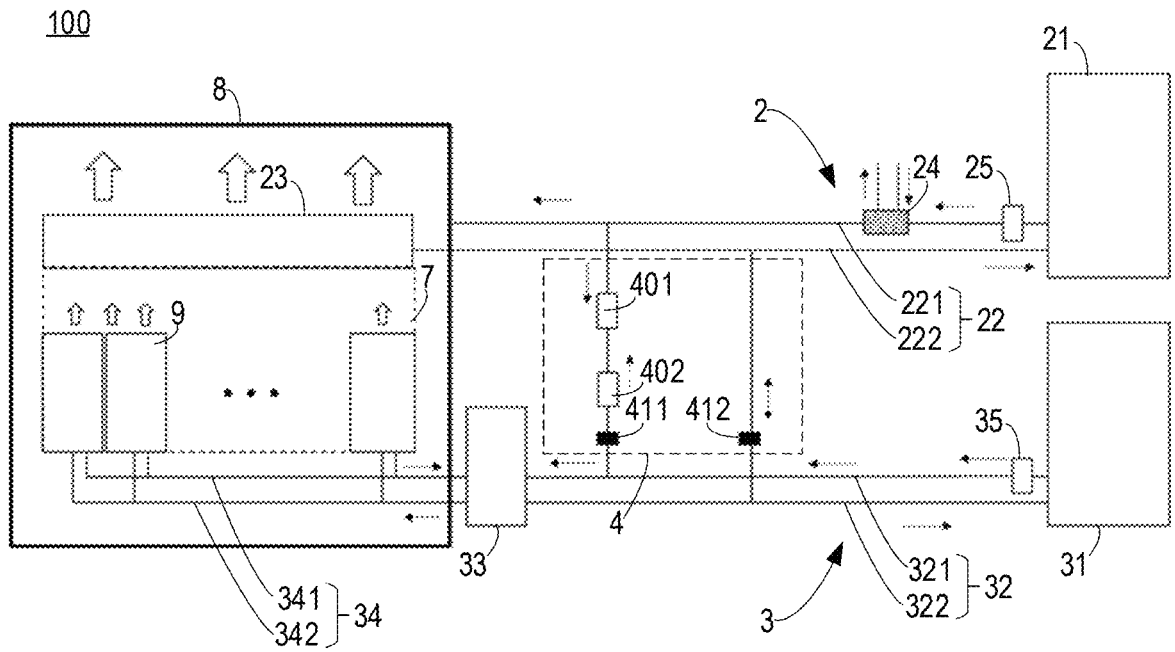
FIG. 5 illustrates a schematic structural diagram of a cooling system according to some embodiments of the present disclosure.

FIG. 5 illustrates a schematic structural diagram of a cooling system 100 according to some embodiments of the present disclosure. The structure of the cooling system 100 shown in FIG. 5 is similar to that of the cooling system 100 shown in FIG. 4, and differences between them will be described in detail hereinafter, and will not be repeated for the same part.

As shown in FIG. 5, the first valve 411, the first circulation pump 401 and the second circulation pump 402 are connected in series between the first liquid outlet pipe 221 and the second liquid outlet pipe 321. The first valve 411 is opened in both the first state and the second state. When the guide assembly 4 is in the first state, the first circulation pump 401 runs and the second circulation pump 402 stops running, and the first circulation pump 401 may drive a part of the coolant in the first liquid outlet pipe 221 to the second liquid outlet pipe 321 via a bypass in parallel with the second circulation pump 402 and the first valve 411. When the guide assembly 4 is in the second state, the first circulation pump 401 stops running and the second circulation pump 402 runs, and the second circulation pump 402 may drive a part of the coolant in the second liquid outlet pipe 321 to the first liquid outlet pipe 221 via a bypass in parallel with the first circulation pump 401 and the first valve 411.

In some embodiments, when no cold circulation is required between the air cooling part 2 and the liquid cooling part 3, the first circulation pump 401 and the second circulation pump 402 may both stop running, and both the first valve 411 and the second valve 412 may be closed. In this case, the air cooling part 2 and the liquid cooling part 3 can run independently.

Figure 6:
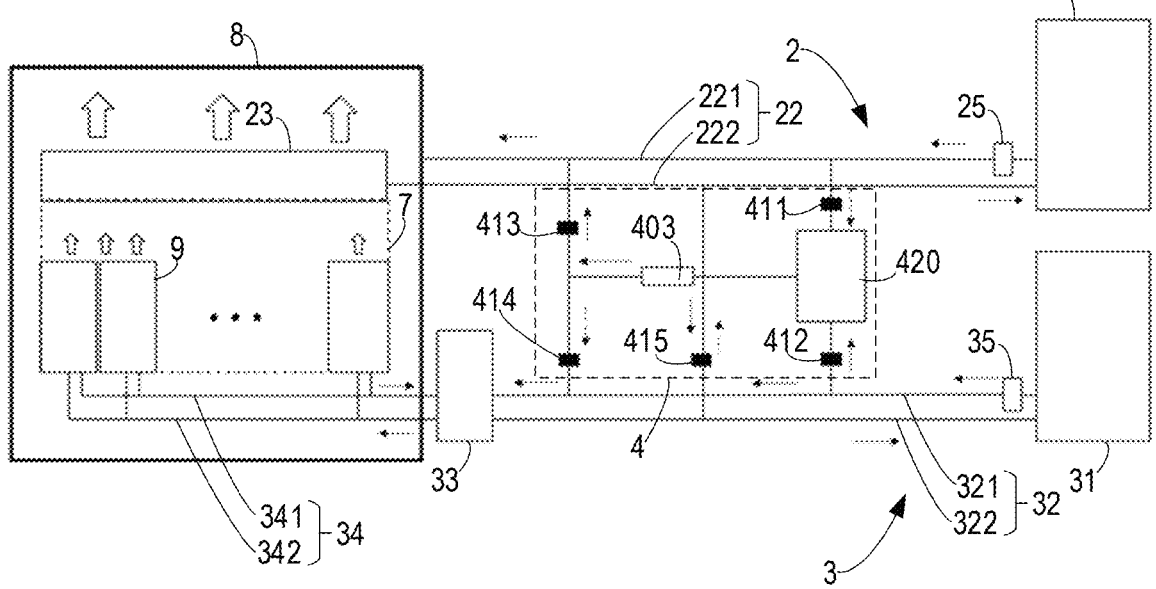
FIG. 6 illustrates a schematic structural diagram of a cooling system according to some embodiments of the present disclosure.

FIG. 6 illustrates a schematic structural diagram of a cooling system 100 according to some embodiments of the present disclosure. The structure of the cooling system 100 shown in FIG. 6 is similar to that of the cooling system 100 shown in FIGS. 2 to 5, and the differences between them will be described in detail hereinafter, and will not be repeated for the same part.

In some embodiments, as shown in FIG. 6, the guide assembly 4 includes a liquid storage cavity 420 and a third circulation pump 403. The liquid storage cavity 420 is connected to the first liquid outlet pipe 221 and the second liquid outlet pipe 321 through a valve. The liquid storage cavity 420 can receive the coolant from the first liquid outlet pipe 221 in the first state and the coolant from the second liquid outlet pipe 321 in the second state. The third circulation pump 403 is connected to the liquid storage cavity 420. The third circulation pump 403 drives the coolant in the liquid storage cavity 420 to the second liquid outlet pipe 321 in the first state. The third circulation pump 403 drives the coolant in the liquid storage cavity 420 to the first liquid outlet pipe 221 in the second state. By providing the liquid storage cavity 420, coolant to be circulated between the air cooling part 2 and the liquid cooling part 3 can be temporarily stored, flow and pressure balance can be easily achieved, and water hammer phenomenon is reduced. In addition, the liquid storage cavity 420 also has an effect of storing cold quantity and supplementing cold.

In some embodiments, as shown in FIG. 6, the guide assembly 4 further includes a first valve 411, a second valve 412, a third valve 413, and a fourth valve 414. The first valve 411 is connected between the first liquid outlet pipe 221 and the liquid storage cavity 420. The first valve 411 is opened in the first state and closed in the second state. The second valve 412 is connected between the second liquid outlet pipe 321 and the liquid storage cavity 420. The second valve 412 is opened in the second state and closed in the first state. The third valve 413 is connected between the first liquid outlet pipe 221 and the outlet of the third circulation pump 403. The third valve 413 is opened in the second state and closed in the first state. The fourth valve 414 is connected between the outlet of the third circulation pump 403 and the second liquid outlet pipe 321. The fourth valve 414 is opened in the first state and closed in the second state.

In some embodiments, as shown in FIG. 6, the guide assembly 4 further includes a fifth valve 415 connected between the first liquid return pipe 222 and the second liquid return pipe 322. The fifth valve 415 is opened in both the first state and the second state.

In the first state, the third circulation pump 403 runs, the first valve 411, the fourth valve 414, and the fifth valve 415 are opened, and the second valve 412 and the third valve 413 are closed. At this time, the coolant in the first liquid outlet pipe 221 may flow into the liquid storage cavity 420 via the first valve 411. The third circulation pump 403 may drive the coolant in the liquid storage cavity 420 into the second liquid outlet pipe 321 via the fourth valve 414; while at least a part of the coolant in the second liquid return pipe 322 may be guided into the first liquid return pipe 222 via the fifth valve 415 and into the first cooler 21 for cooling again. Therefore, when the outdoor temperature is high, since the cold quantity of the first cooler 21 is easier to obtain, a part of the cold quantity in the air cooling part 2 may be provided to the liquid cooling part 3, and the second cooler 31 does not need to be made very large in order to achieve a cold quantity requirement of the liquid cooling part 3 in extreme weather, and will have a good saving on economy.

In the second state, the third circulation pump 403 runs, the second valve 412, the third valve 413, and the fifth valve 415 are opened, and the first valve 411 and the fourth valve 414 are closed. At this time, the coolant in the second liquid outlet pipe 321 may flow into the liquid storage cavity 420 through the second valve 412. The third circulation pump 403 may drive the coolant in the liquid storage cavity 420 into the first liquid outlet pipe 221 through the third valve 413; while at least a part of the coolant in the first liquid return pipe 222 may be guided into the second liquid return pipe 322 via the fifth valve 415 and into the second cooler 31 for cooling again. Therefore, when the outdoor temperature is lower, the heat exchange efficiency of the second cooler 31 is high, and the cold quantity of the second cooler 31 may be provided to the air cooling part 2 to help the air wall 23 to cool. In this case, the first cooler 21 can only partially run or even completely stop, comprehensively improve the natural cooling proportion of the data center, thereby achieving a large amount of energy consumption saving and water consumption saving.

In some embodiments, when no cold circulation is required between the air cooling part 2 and the liquid cooling part 3, the third circulation pump 401 may be stopped from running and the first valve 411, the second valve 412, the third valve 413, the fourth valve 414, and the fifth valve 415 may all be closed. In this case, the air cooling part 2 and the liquid cooling part 3 can run independently.

It should be understood that, in the embodiments according to the present disclosure, the guide assembly 4 may include more circulation pumps and/or more valves for controlling the circulation manner of the coolant between the air cooling part 2 and the liquid cooling part 3. In addition, in the embodiments according to the present disclosure, a running state of the circulation pumps and the opening/closing state of the valves may be implemented by automatic control or manual control, which is not limited in the embodiments of the present disclosure.

The cooling system 100 according to the embodiments of the present disclosure has high adaptability in global range, can improve the natural cooling proportion while reducing the initial investment cost and the occupied area, and achieves extremely low PUE and WUE. In addition, the cooling system 100 according to the embodiment of the present disclosure is simplified in design, less in mechanical and power components, low in total cost, and convenient for large-scale popularization and deployment.

Various embodiments of the present disclosure have been described above, which are exemplary, not exhaustive, and are not limited to the embodiments disclosed. Many modifications and variations will be apparent to those of ordinary skill in the art without departing from the scope and spirit of illustrated embodiments. Selection of the terms used herein is intended to best explain principles of the embodiments, practical applications, or technical improvements in marketplace, or to enable others of ordinary skill in the art to understand the embodiments disclosed herein.

We claim:

1. A cooling system comprising:
an air cooling part comprising a first cooler and a first circulation pipeline connected to the first cooler, the first cooler being configured to cool a coolant inside it with an external liquid, and the first circulation pipeline comprising a first liquid outlet pipe and a first liquid return pipe;
a liquid cooling part comprising a second cooler and a second circulation pipeline connected to the second cooler, the second cooler being configured to cool a coolant inside it with an external gas, and the second circulation pipeline comprising a second liquid outlet pipe and a second liquid return pipe; and
a guide assembly connected between the first circulation pipeline and the second circulation pipeline and configured to: in a first state, drive a part of the coolant in the first liquid outlet pipe into the second liquid outlet pipe and guide at least a part of the coolant in the second liquid return pipe into the first liquid return pipe, and in a second state, drive a part of the coolant in the second liquid outlet pipe into the first liquid outlet pipe and guide at least a part of the coolant in the first liquid return pipe into the second liquid return pipe,
wherein the guide assembly comprises:
a first circulation pump running in the first state and stopping running in the second state, the first circulation pump, upon running, driving a part of the coolant in the first liquid outlet pipe into the second liquid outlet pipe; and
a second circulation pump running in the second state and stopping running in the first state, the second circulation pump, upon running, driving a part of the coolant in the second liquid outlet pipe into the first liquid outlet pipe.

2. The cooling system of claim 1, wherein the guide assembly further comprises a first valve, a second valve, a third valve, and a fourth valve;
the first valve and the first circulation pump are connected in series between the first liquid outlet pipe and the second liquid outlet pipe, and the first valve is opened in the first state and closed in the second state;
the second valve and the second circulation pump are connected in series between the first liquid outlet pipe and the second liquid outlet pipe, and the second valve is opened in the second state and closed in the first state;
the third valve is connected between the first liquid return pipe and the second liquid return pipe, and the third valve is opened in the first state and closed in the second state; and
the fourth valve is connected between the first liquid return pipe and the second liquid return pipe, and the fourth valve is opened in the second state and closed in the first state.

3. The cooling system of claim 1, wherein the guide assembly further comprises a first valve, a second valve, and a third valve;
the first valve and the first circulation pump are connected in series between the first liquid outlet pipe and the second liquid outlet pipe, and the first valve is opened in the first state and closed in the second state;
the second valve and the second circulation pump are connected in series between the first liquid outlet pipe and the second liquid outlet pipe, and the second valve is opened in the second state and closed in the first state; and
the third valve is connected between the first liquid return pipe and the second liquid return pipe, and the third valve is opened in both the first state and the second state.

4. The cooling system of claim 1, wherein the guide assembly further comprises a first valve and a second valve;
the first circulation pump and the second circulation pump are connected in parallel, and are connected in series with the first valve between the first liquid outlet pipe and the second liquid outlet pipe, and the first valve is opened in both the first state and the second state; and
the second valve is connected between the first liquid return pipe and the second liquid return pipe, and the second valve is opened in both the first state and the second state.

5. The cooling system of claim 1, wherein the guide assembly further comprises a first valve and a second valve;
the first valve, the first circulation pump and the second circulation pump are connected in series between the first liquid outlet pipe and the second liquid outlet pipe, and the first valve is opened in both the first state and the second state; and
the second valve is connected between the first liquid return pipe and the second liquid return pipe, and the second valve is opened in both the first state and the second state.

6. The cooling system of claim 1, wherein the first cooler comprises a cooling tower, and/or the second cooler comprises a dry cooler.

7. A cooling system, comprising:
an air cooling part comprising a first cooler and a first circulation pipeline connected to the first cooler, the first cooler being configured to cool a coolant inside it with an external liquid, and the first circulation pipeline comprising a first liquid outlet pipe and a first liquid return pipe;
a liquid cooling part comprising a second cooler and a second circulation pipeline connected to the second cooler, the second cooler being configured to cool a coolant inside it with an external gas, and the second circulation pipeline comprising a second liquid outlet pipe and a second liquid return pipe; and
a guide assembly connected between the first circulation pipeline and the second circulation pipeline and configured to: in a first state, drive a part of the coolant in the first liquid outlet pipe into the second liquid outlet pipe and guide at least a part of the coolant in the second liquid return pipe into the first liquid return pipe, and in a second state, drive a part of the coolant in the second liquid outlet pipe into the first liquid outlet pipe and guide at least a part of the coolant in the first liquid return pipe into the second liquid return pipe,
wherein the guide assembly comprises:
a liquid storage cavity connected to the first liquid outlet pipe and the second liquid outlet pipe through a valve, and configured to receive the coolant from the first liquid outlet pipe in the first state and receive the coolant from the second liquid outlet pipe in the second state; and
a third circulation pump connected to the liquid storage cavity and configured to drive a coolant in the liquid storage cavity to the second liquid outlet pipe in the first state and drive the coolant in the liquid storage cavity to the first liquid outlet pipe in the second state.

8. The cooling system of claim 7, wherein the guide assembly further comprises a first valve, a second valve, a third valve, and a fourth valve;

the first valve is connected between the first liquid outlet pipe and the liquid storage cavity, and the first valve is opened in the first state and closed in the second state;

the second valve is connected between the second liquid outlet pipe and the liquid storage cavity, and the second valve is opened in the second state and closed in the first state;

the third valve is connected between the first liquid outlet pipe and an outlet of the third circulation pump, and the third valve is opened in the second state and closed in the first state; and the fourth valve is connected between the outlet of the third circulation pump and the second liquid outlet pipe, and the fourth valve is opened in the first state and closed in the second state.

9. The cooling system of claim 7, wherein the guide assembly further comprises a fifth valve connected between the first liquid return pipe and the second liquid return pipe, and the fifth valve is opened in both the first state and the second state.

* * * * *